(12) United States Patent
Li et al.

(10) Patent No.: US 12,373,739 B1
(45) Date of Patent: Jul. 29, 2025

(54) SYSTEM AND METHOD FOR FEDERATED TWO-STAGE COMPRESSION WITH FEDERATED JOINT LEARNING

(71) Applicant: AtomBeam Technologies Inc., Moraga, CA (US)

(72) Inventors: Zhu Li, Overland Park, KS (US); Paras Maharjan, Kansas City, MO (US); Brian Galvin, Silverdale, WA (US)

(73) Assignee: ATOMBEAM TECHNOLOGIES INC., Moraga, CA (US)

( * ) Notice: Subject to any disclaimer, the term of this patent is extended or adjusted under 35 U.S.C. 154(b) by 0 days.

(21) Appl. No.: 18/890,748

(22) Filed: Sep. 19, 2024

Related U.S. Application Data

(63) Continuation-in-part of application No. 18/623,018, filed on Mar. 31, 2024, now Pat. No. 12,119,848.

(51) Int. Cl.
*H03M 7/00* (2006.01)
*G06F 5/01* (2006.01)
*G06N 20/00* (2019.01)

(52) U.S. Cl.
CPC .............. *G06N 20/00* (2019.01); *G06F 5/01* (2013.01)

(58) Field of Classification Search
CPC .......................... G06N 3/0455; H03M 7/3082
See application file for complete search history.

(56) References Cited

U.S. PATENT DOCUMENTS

| | | | |
|---|---|---|---|
| 6,990,246 B1 * | 1/2006 | Ferguson | H04N 19/129 375/E7.064 |
| 10,827,039 B1 | 11/2020 | Dandekar et al. | |
| 2021/0232544 A1 * | 7/2021 | Cooper | G06F 3/0608 |
| 2023/0019128 A1 * | 1/2023 | Zeghidour | G06N 3/045 |

* cited by examiner

*Primary Examiner* — Jean B Jeanglaude
(74) *Attorney, Agent, or Firm* — Galvin Patent Law LLC; Brian R. Galvin

(57) ABSTRACT

A system and method for federated two-stage compression with federated joint learning. The system and method proposed allow for fast and efficient lossless data compression of a large variety of data types. The system and method have a variety of real-world applications, including deep learning solutions for telemetry, tracking, and command subsystems for satellites. Satellites and their control centers are incredibly spaced apart which makes data compression an extremely important process to transmit large sets of information in a low-latency, high-efficiency environment. The proposed system and method utilize probability prediction driven arithmetic coding which provides faster encoding times and higher compression ratios when paired with a long short-term memory system for data compression.

15 Claims, 10 Drawing Sheets

SYSTEM AND METHOD FOR FEDERATED TWO-STAGE COMPRESSION WITH FEDERATED JOINT LEARNING

CROSS-REFERENCE TO RELATED APPLICATIONS

Priority is claimed in the application data sheet to the following patents or patent applications, each of which is expressly incorporated herein by reference in its entirety: Ser. No. 18/623,018

BACKGROUND OF THE INVENTION

Field of the Art

The present invention is in the field of data compression, and more particularly is directed to the problem of efficiently compressing large sets of data without losing information.

Discussion of the State of the Art

Data compression plays an integral part in manipulating vast sets of information. The process allows data to be compressed into a smaller, more manageable format which allows the data to be analyzed, processed, and transferred. An ideal method for data compression attempts to preserve as much of the original information as possible while also being fast and efficient. Generally, there are two main categories of data compression: lossless compression and lossy compression.

Lossless data compression is a process where none of the original information is sacrificed in the compression process. Information that has been compressed using a lossless compression algorithm will be exactly reproduced when the information is decompressed. This process is typically used for data types such as text files, executable programs, and some images. By contrast, lossy data compression algorithms sacrifice some of the original information in the compression process to achieve higher compression ratios. When information that has been compressed using a lossy compression algorithm is decompressed, the resulting file will be similar to the original information, but some portions of the original information may be missing. This method is generally reserved for file types such as Joint Photographic Experts Groups (JPEGs), Moving Picture Experts Groups (MPEGs), and MPEG Audio Layer III (MP3) files. With JPEGs, MPEGs, and MP3s, original information can still be identified even if some information is lost after the compression and decompression process. A third approach to data compression is transform coding where information is translated into a domain separate from the original domain. This process includes processes such as Discrete Cosine Transforms (DCT) and Discrete Wavelet Transforms (DWT) which are most commonly associated with the compression of images and audio files.

One area where data compression has become exceedingly important is related to telemetry, tracking, and command (TT&C) subsystems which are used in satellite systems. TT&C subsystems play a crucial role in facilitating essential communications between satellites and ground stations. In many cases, TT&C subsystems are the sole means through which satellites' operations and status can be monitored and controlled remotely from earth. Many satellite systems demand transmitting massive quantities of information over large distances; a process which becomes exponentially easier when the information is compressed.

What is needed is a system and method for learning-based lossless data compression where information can be reliably and efficiently compressed with low-latency and without the loss of information during compression. By integrating a plurality of neural networks into a compression system and method, information can be reliably compressed with low-latency and high efficiency all while keeping the original information intact throughout the process.

SUMMARY OF THE INVENTION

Accordingly, the inventor has conceived and reduced to practice, a system and method for federated two-stage compression with federated joint learning. The system and method proposed allow for fast and efficient lossless data compression of a large variety of data types. The system and method have a variety of real-world applications, including deep learning solutions for telemetry, tracking, and command subsystems for satellites. Because satellites and their control centers are incredibly spaced apart, data compression for information flowing between the two needs to be low-latency and high efficiency. Additionally, the proposed system and method utilize probability prediction driven arithmetic coding which provide faster encoding times and higher compression ratios when paired with a long short-term memory system for data compression.

According to a preferred embodiment, a system for federated two-stage compression with federated joint learning, comprising one or more computers with executable instructions that, when executed, cause the system to: process input data through a compression network on an edge server to generate a plurality of compressed data; transmit the plurality of compressed data to a midserver, wherein the midserver converts the plurality of compressed data into a plurality of codewords using a codebook; train and deploy a lightweight codeword model on the edge server wherein the lightweight codeword model is trained using the plurality of codewords; and compress the input data through the lightweight codeword model on the edge server to generate a second plurality of compressed data, is disclosed.

According to another preferred embodiment, a method for federated two-stage compression with federated joint learning, comprising the steps of: processing input data through a compression network on an edge server to generate a plurality of compressed data; transmitting the plurality of compressed data to a midserver, wherein the midserver converts the plurality of compressed data into a plurality of codewords using a codebook; training and deploy a lightweight codeword model on the edge server wherein the lightweight codeword model is trained using the plurality of codewords; and compressing the input data through the lightweight codeword model on the edge server to generate a second plurality of compressed data, is disclosed.

According to another preferred embodiment, a non-transitory, computer-readable storage media having computer-executable instructions embodied thereon that, when executed by one or more processors of a computing system employing an asset registry platform for secure, robust, and efficient blockchain management system using large codeword models, cause the computing system to: process input data through a compression network on an edge server to generate a plurality of compressed data; transmit the plurality of compressed data to a midserver, wherein the midserver converts the plurality of compressed data into a plurality of codewords using a codebook; train and deploy a lightweight codeword model on the edge server wherein the lightweight codeword model is trained using the plurality of codewords; and compress the input data through the lightweight codeword model on the edge server to generate a second plurality of compressed data, is disclosed.

According to an aspect of an embodiment, the plurality of codewords are transmitted to a cloud that converts the plurality of codewords into a plurality of codewords using a universal codebook.

According to an aspect of an embodiment, the plurality of universal codewords are used to train a large codeword model.

According to an aspect of an embodiment, updated models of the lightweight codeword model or the compression network may be stored in and transferred between the edge server, the midserver, and the cloud.

According to an aspect of an embodiment, a plurality of codebooks may be stored on the midserver and used to generate codewords for a plurality of edge servers, wherein each edge server has its own specific set of codewords

BRIEF DESCRIPTION OF THE DRAWING FIGURES

DETAILED DESCRIPTION OF THE INVENTION

Figure 1:
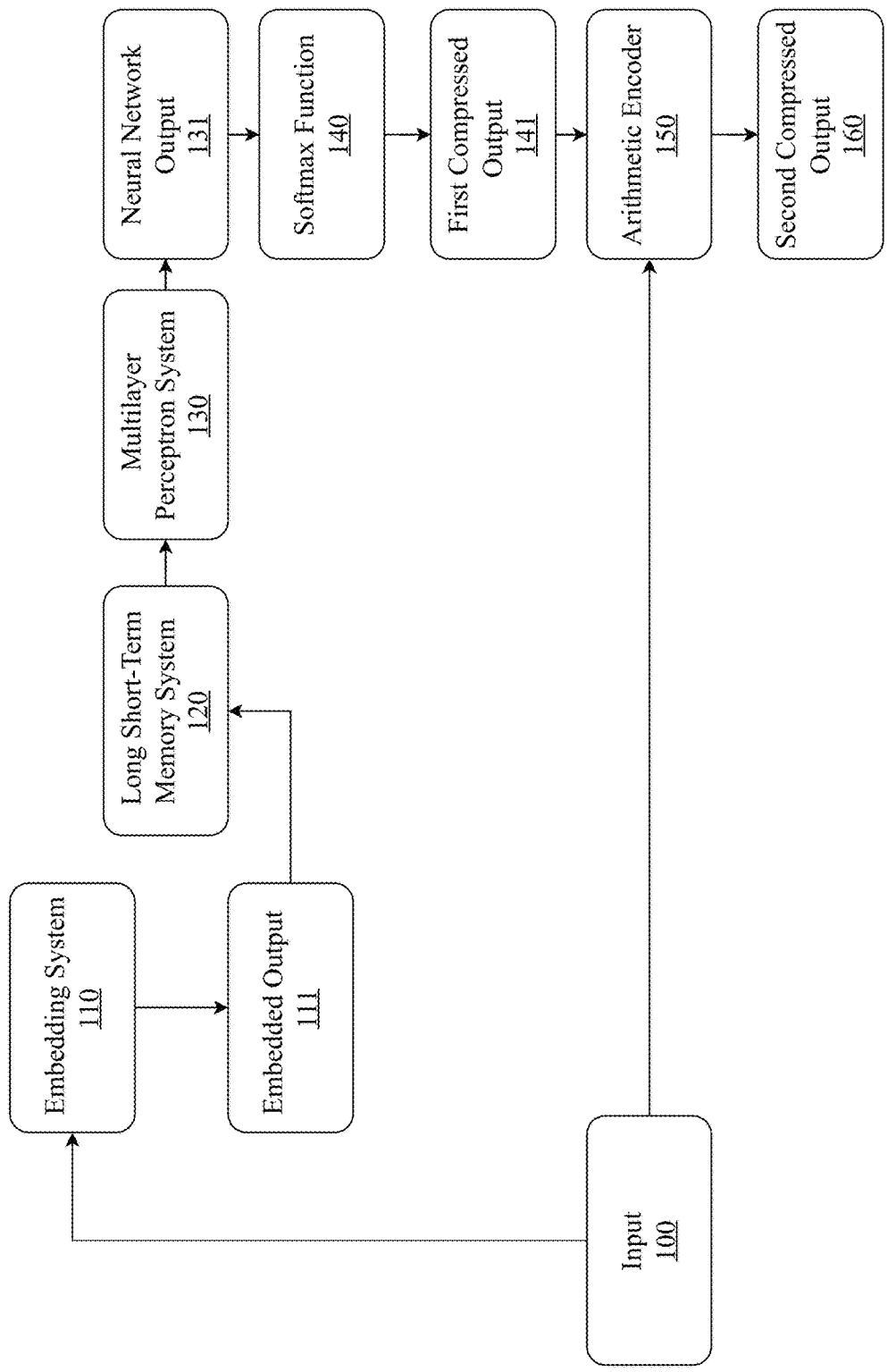
FIG. 1 is a block diagram illustrating an exemplary system architecture for learning-based lossless data compression.

The inventor has conceived, and reduced to practice, a system and method for federated two-stage compression with federated joint learning.

One or more different aspects may be described in the present application. Further, for one or more of the aspects described herein, numerous alternative arrangements may be described; it should be appreciated that these are presented for illustrative purposes only and are not limiting of the aspects contained herein or the claims presented herein in any way. One or more of the arrangements may be widely applicable to numerous aspects, as may be readily apparent from the disclosure. In general, arrangements are described in sufficient detail to enable those skilled in the art to practice one or more of the aspects, and it should be appreciated that other arrangements may be utilized and that structural, logical, software, electrical and other changes may be made without departing from the scope of the particular aspects. Particular features of one or more of the aspects described herein may be described with reference to one or more particular aspects or figures that form a part of the present disclosure, and in which are shown, by way of illustration, specific arrangements of one or more of the aspects. It should be appreciated, however, that such features are not limited to usage in one or more particular aspects or figures with reference to which they are described. The present disclosure is neither a literal description of all arrangements of one or more of the aspects nor a listing of features of one or more of the aspects that must be present in all arrangements.

Headings of sections provided in this patent application and the title of this patent application are for convenience only and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible aspects and in order to more fully illustrate one or more aspects. Similarly, although process steps, method steps, algorithms or the like may be described in a sequential order, such processes, methods, and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the aspects, and does not imply that the illustrated process is preferred. Also, steps are generally described once per aspect, but this does not mean they must occur once, or that they may only occur once each time a process, method, or algorithm is carried out or executed. Some steps may be omitted in some aspects or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of more than one device or article.

The functionality or the features of a device may be alternatively embodied by one or more other devices that are not explicitly described as having such functionality or features. Thus, other aspects need not include the device itself.

Techniques and mechanisms described or referenced herein will sometimes be described in singular form for clarity. However, it should be appreciated that particular aspects may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of various aspects in which, for example, functions may be executed out of order from that shown or discussed, including substantially concurrently or in reverse order, depending on the functionality involved, as would be understood by those having ordinary skill in the art.

Conceptual Architecture

FIG. 1 is a block diagram illustrating an exemplary system architecture for learning-based lossless data compression. In one embodiment, the system and method may comprise an input 100, an embedding system 110, an embedded output 111, a long short-term memory system (LSTM) 120, a multilayer perceptron system 130, a neural network output 131, a SoftMax function 140, a first compressed output 141, an arithmetic encoder 150, and a second compressed output 160. In one embodiment, the embedding system 110 receives the input 100 or plurality of inputs 100 from a source. The input 100 may include, but is not limited to a text file, a video file, an audio file, or any other file which includes a plurality of information. The embedding system 110 prepares an input 100 for further processing by a plurality of neural network systems. The embedding system 110 turns the input 100 into an embedded output 111 which may then be processed by a long short-term memory system 120.

In one embodiment, the long short-term memory system 120 is a plurality of recurring neural network architectures which further processes the embedded output 111 for compression. The LSTM 120 is a special kind of recurring neural network where the present output depends on the LSTM's understanding of the previous output. The LSTM 120 is capable of learning long term dependency through the use of a plurality of gates that allows the LSTM 120 to add and remove information to a cell state. After an embedded output 111 is processed by the LSTM 120, the embedded output 111 is processed by the multilayer perceptron system 130. The multilayer perceptron system (MLP) 130 is a neural network which uses a PAQ algorithm to achieve data compression. A PAQ algorithm refers to a plurality of lossless data compression algorithms which are exceptionally effective and have high compression ratios for many different data types. In one embodiment, the MLP 130 may be a shallow MLP where a plurality of inputs are operated on by a plurality of weights which creates a large linear plurality of hidden nodes which are grouped into sets. The plurality of hidden nodes may be operated on a small plurality of additional weights which converges the hidden nodes into a single output node. A key feature of a shallow MLP 130 is that the plurality of hidden nodes are operated on by the additional weights in one step, rather than a plurality of steps. In one embodiment, the embedded output 111 which has been processed by the LSTM 120 is transformed by the MLP 130 which may be a shallow MLP 130 into a neural network output 131. The neural network output 131 may then be operated on by a SoftMax function 140 which generates a compressed output 141. The compressed output 141 is a compressed version of the input 100 where no information has been lost during the compression process.

In another embodiment, the first compressed output 141 may then be passed to an arithmetic encoder 150 which may also receive the input 100. The arithmetic encoder 150 may generate a probability output by analyzing and processing the input 100 and the first compressed output 141. The arithmetic encoder 150 may also receive the input 100 and the first compressed output 141 where it generates a second compressed output 160. Generally, an arithmetic encoder receives a string with a length which is compressed to the shortest byte string which represents a number (X) within a particular range. In some embodiments, the arithmetic encoder 150 may be an arithmetic encoder in PAQ. An arithmetic encoder in PAQ maintains for each prediction an upper and lower limit on X. Concluding each prediction, the current range of X is split into parts representing the probabilities that the next bit of the string is either a 0 or a 1, which may be based on previous bits of the string. The next bit may then be encoded by selecting a new range to take place of the previous range of X. Generally, the upper and lower limits are represented in three segments. The first segment generally has the same base-256 digits and are often presented as the leading bytes of X. The next segment is generally stored in memory which the first digit in the segment varies from the remaining digits. The remaining segment is generally assumed to be zeros for the lower limit and ones for the upper limit. In one embodiment, compression may cease when one or more bytes are written from the lower bound of X.

Figure 2:
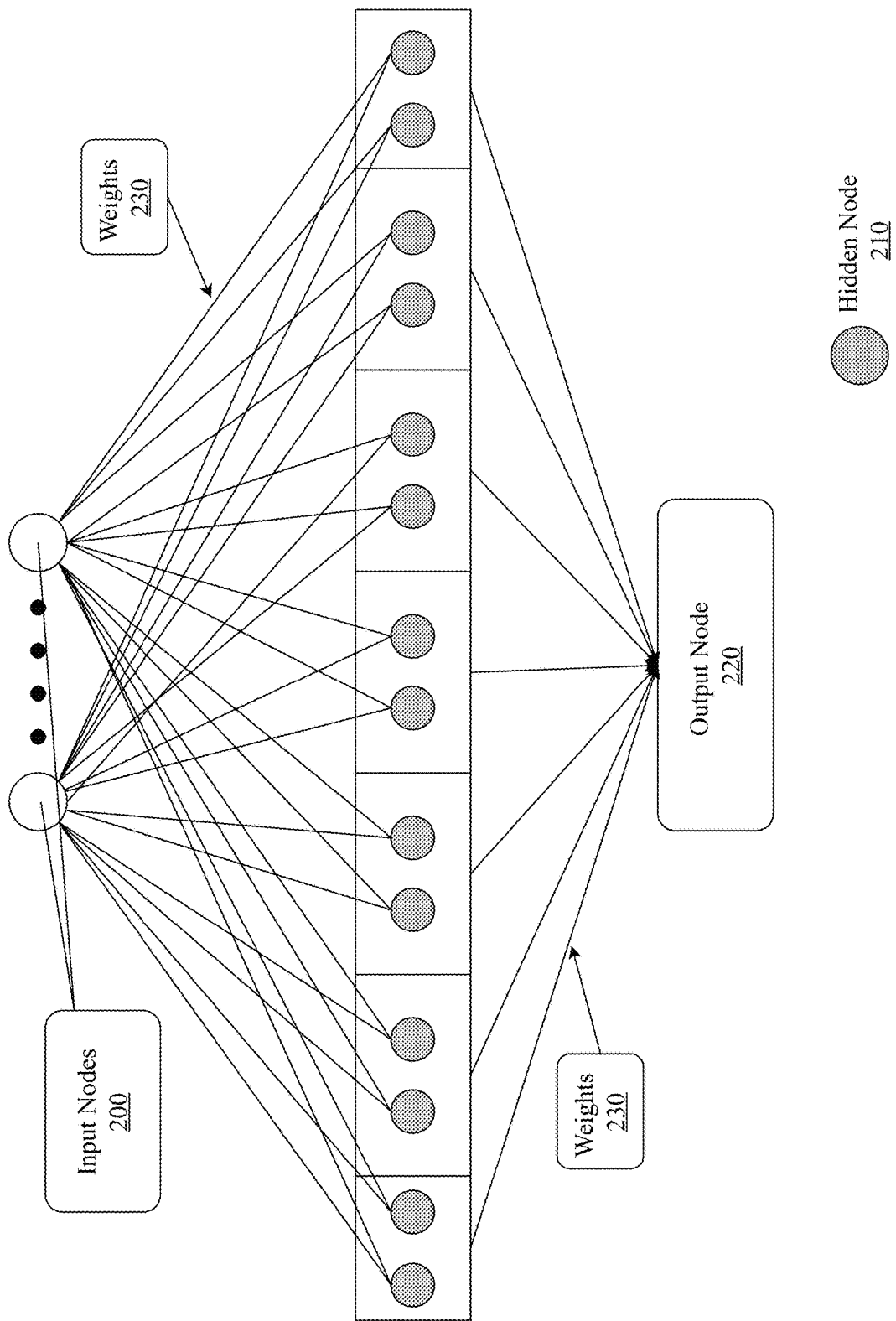
FIG. 2 is a block diagram illustrating an exemplary architecture for a subsystem of the system for learning-based lossless data compression, a multilayer perceptron system.

FIG. 2 is a block diagram illustrating an exemplary architecture for a subsystem of the system for learning-based lossless data compression, a multilayer perceptron system 130. In an embodiment, the multilayer perceptron system 130 may receive a plurality of inputs which begin as input nodes 200. The plurality of input nodes 200 are operated on by a plurality of predetermined weights. The plurality of predetermined weights 230 creates a plurality of hidden nodes 210 which may exist in a grouped sequence. In one embodiment, there may be 552 input nodes where are operated on by 3080 weights. This creates 3080 new hidden nodes which exist in seven sets, each set containing a plurality of hidden nodes 210. Each set of hidden nodes 210 is then operated on by an additional layer of weights 230 which may or may not be similar to the weights used on the input nodes. In embodiment where the hidden nodes 210 exist in seven sets, there will be seven additional weights. The additional weights act on the sets of hidden nodes 210 to create a plurality of output nodes 220.

Figure 3:
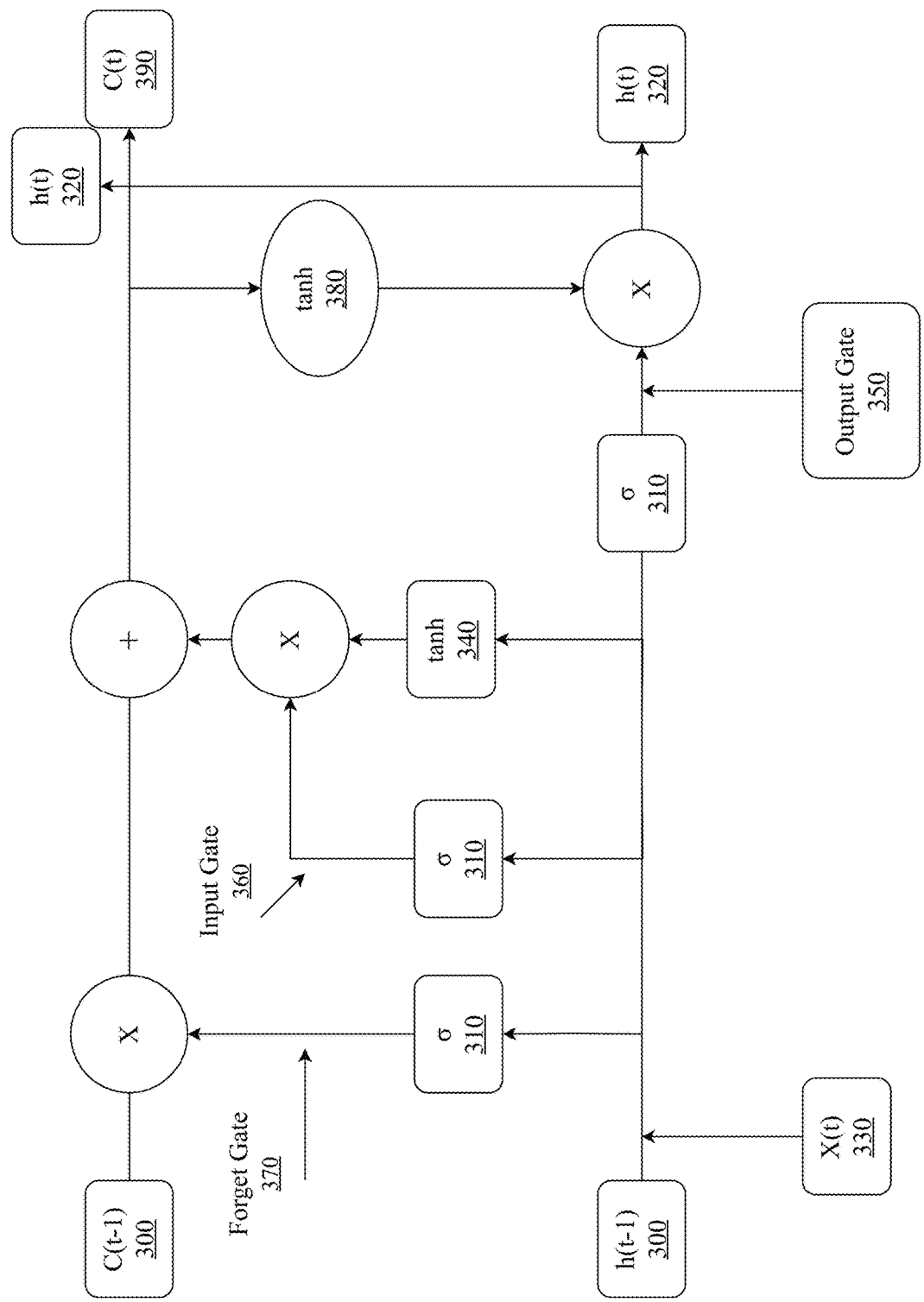
FIG. 3 is a block diagram illustrating an exemplary architecture for a subsystem of the system for learning-based lossless data compression, a long short-term memory system.

FIG. 3 is a block diagram illustrating an exemplary architecture for a subsystem of the system for learning-based lossless data compression, a long short-term memory system 120. In one embodiment, the LSTM system 120 is further comprised of a plurality of functions where the present output depends on understanding the previous output. The LSTM system 120 is capable of learning long term dependency and a plurality of gates allow the system to add and remove information to a cell state. The flow state in FIG. 4 may be governed by the following functions in one embodiment:

$$i_t = \sigma(W_{ix}x_t + W_{ih}h_{t-1} + b_i)$$

$$f_t = \sigma(W_{fx}x_t + W_{fh}h_{t-1} + b_f)$$

$$O_t = \sigma(W_{ox}x_t + W_{oh}h_{t-1} + b_o)$$

$$c_t = f_t \odot c_{t-1} + i_t \odot \tanh(W_{cx}x_t + W_{ch}h_{t-1} + b_c)$$

$$h_t = O_t \odot (\tanh(c_t))$$

Where $i_t$ represents an input gate 360, $f_t$ represents a forget gate 370, and $O_t$ represents an output gate 350. The forget gate 370 allows the system to remove information from a cell state, the input gate 360 allows the system to add information to a cell state, and the output gate 350 allows the system to output information from a cell state.

Detailed Description of Exemplary Aspects

Figure 4:
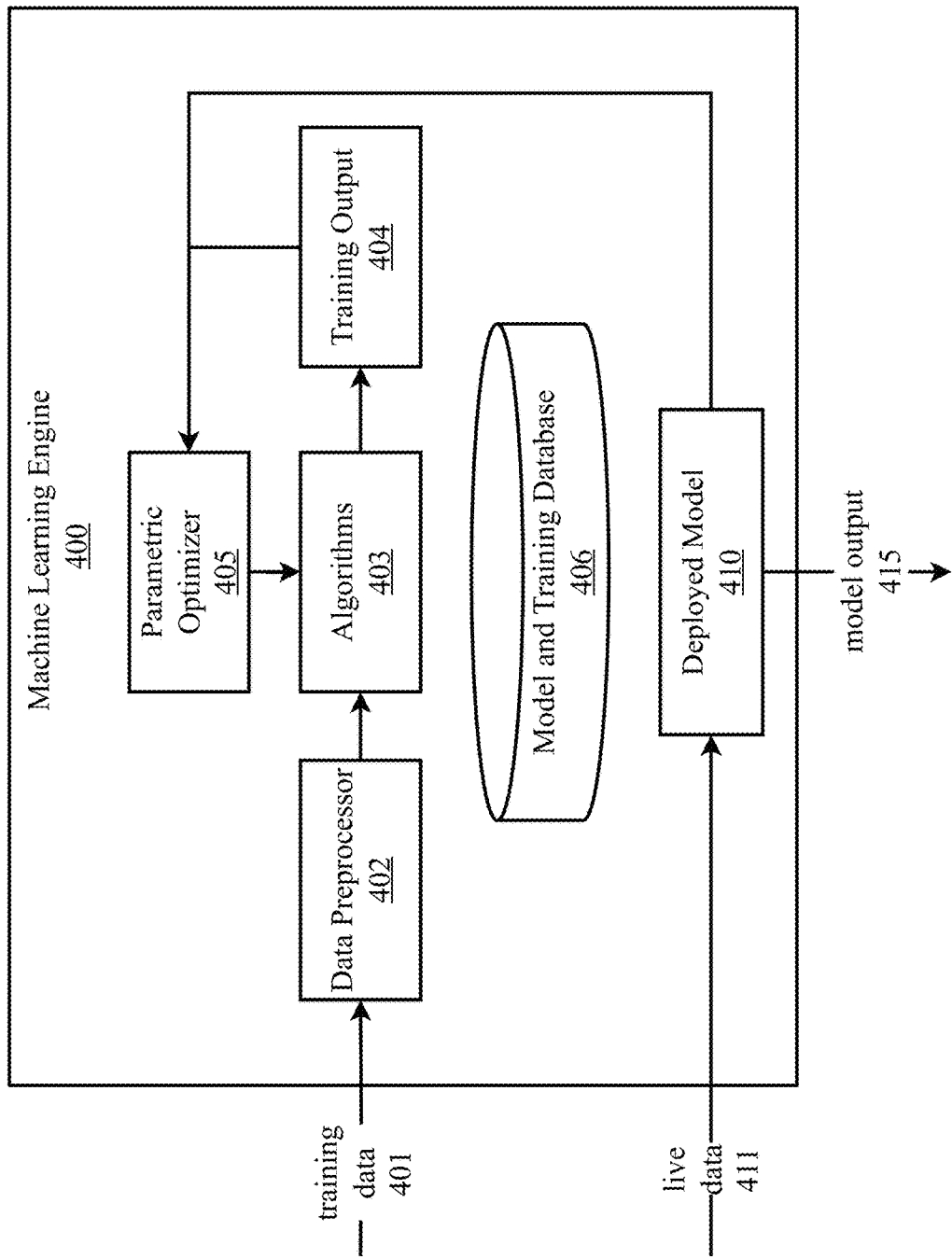
FIG. 4 is a block diagram illustrating an exemplary machine learning model for either the multilayer perceptron system or the long short-term memory system.

FIG. 4 is a block diagram illustrating an exemplary machine learning model for either the multilayer perceptron system or the long short-term memory system. According to the embodiment, the multilayer perceptron system 130 or the long short-term memory system 120 may comprise a machine learning engine 400 which may further comprise a model training stage comprising a data preprocessor 402, one or more machine and/or deep learning algorithms 403, training output 404, and a parametric optimizer 405, and a model deployment stage comprising a deployed and fully trained model 410 configured to perform tasks described herein such as transcription, summarization, agent coaching, and agent guidance. Machine learning engine 400 may be used to train and deploy a long short-term memory system 120 and the multilayer perceptron system 130 in order to support the services provided by the lossless data compression system.

At the model training stage, a plurality of training data 401 may be received by the machine learning engine 400. In some embodiments, the plurality of training data may be obtained from one or more database(s) 108 and/or directly from various information sources such as a plurality of contact centers 120. In a use case, a plurality of training data may be sourced TT&C satellite subsystems. It could include text files, audio or video files, or other forms of data. Data preprocessor 402 may receive the input data and perform various data preprocessing tasks on the input data to format the data for further processing. For example, data preprocessing can include, but is not limited to, tasks related to data cleansing, data deduplication, data normalization, data transformation, handling missing values, feature extraction and selection, mismatch handling, and/or the like. Data preprocessor 402 may also be configured to create training dataset, a validation dataset, and a test set from the plurality of input data 401. For example, a training dataset may comprise 80% of the preprocessed input data, the validation set 10%, and the test dataset may comprise the remaining 10% of the data. The preprocessed training dataset may be fed as input into one or more machines and/or deep learning algorithms 403 to train a predictive model for object monitoring and detection.

During model training, training output 404 is produced and used to measure the accuracy and usefulness of the predictive outputs. During this process a parametric optimizer 405 may be used to perform algorithmic tuning between model training iterations. Model parameters and hyperparameters can include, but are not limited to, bias, train-test split ratio, learning rate in optimization algorithms (e.g., gradient descent), choice of optimization algorithm (e.g., gradient descent, stochastic gradient descent, of Adam optimizer, etc.), choice of activation function in a neural network layer (e.g., Sigmoid, ReLu, Tanh, etc.), the choice of cost or loss function the model will use, number of hidden layers in a neural network, number of activation unites in each layer, the drop-out rate in a neural network, number of iterations (epochs) in a training the model, number of clusters in a clustering task, kernel or filter size in convolutional layers, pooling size, batch size, the coefficients (or weights) of linear or logistic regression models, cluster centroids, and/or the like. Parameters and hyperparameters may be tuned and then applied to the next round of model training. In this way, the training stage provides a machine learning training loop. In some implementations, various accuracy metrics may be used by machine learning engine 400 to evaluate a model's performance. Metrics can include, but are not limited to, information loss, latency, and resource consumption.

A model and training database 406 is present and configured to store training/test datasets and developed models. Database 406 may also store previous versions of models. According to some embodiments, the one or more machine and/or deep learning models may comprise any suitable algorithm known to those with skill in the art including, but not limited to: LLMs, generative transformers, transformers, supervised learning algorithms such as: regression (e.g., linear, polynomial, logistic, etc.), decision tree, random forest, k-nearest neighbor, support vector machines, Naïve-Bayes algorithm; unsupervised learning algorithms such as clustering algorithms, hidden Markov models, singular value decomposition, and/or the like. Alternatively, or additionally, algorithms 403 may comprise a deep learning algorithm such as neural networks (e.g., recurrent, convolutional, long short-term memory networks, etc.).

In some implementations, ML engine 400 automatically generates standardized model scorecards for each model produced to provide rapid insights into the model and training data, maintain model provenance, and track performance over time. These model scorecards provide insights into model framework(s) used, training data, training data specifications such as chip size, stride, data splits, baseline hyperparameters, and other factors. Model scorecards may be stored in model and training database 406.

Figure 5:
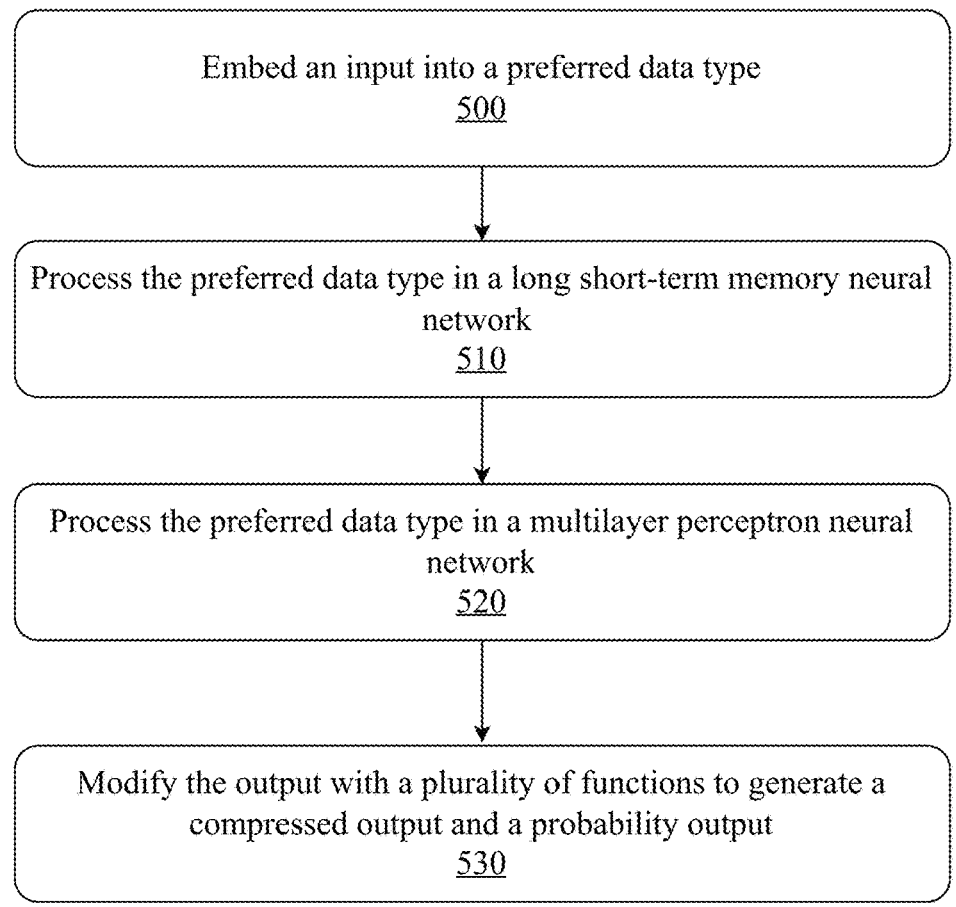
FIG. 5 is a flow diagram illustrating an exemplary method of learning-based data compression.

FIG. 5 is a flow diagram illustrating an exemplary method of learning-based data compression. In a first step 500, embed an input into a preferred data type. The input may be a data type including but not limited to, text files, audio files, video files, and any other data type which carries information. In a step 510, process the preferred data type in a long short-term memory neural network. In a step 520, process the preferred data type in a multilayer perceptron neural network which creates an output. In a step 530, modify the output with a plurality of functions to generate a compressed output and a probability output. The plurality of functions may include a SoftMax function and an arithmetic encoding algorithm.

Figure 6:
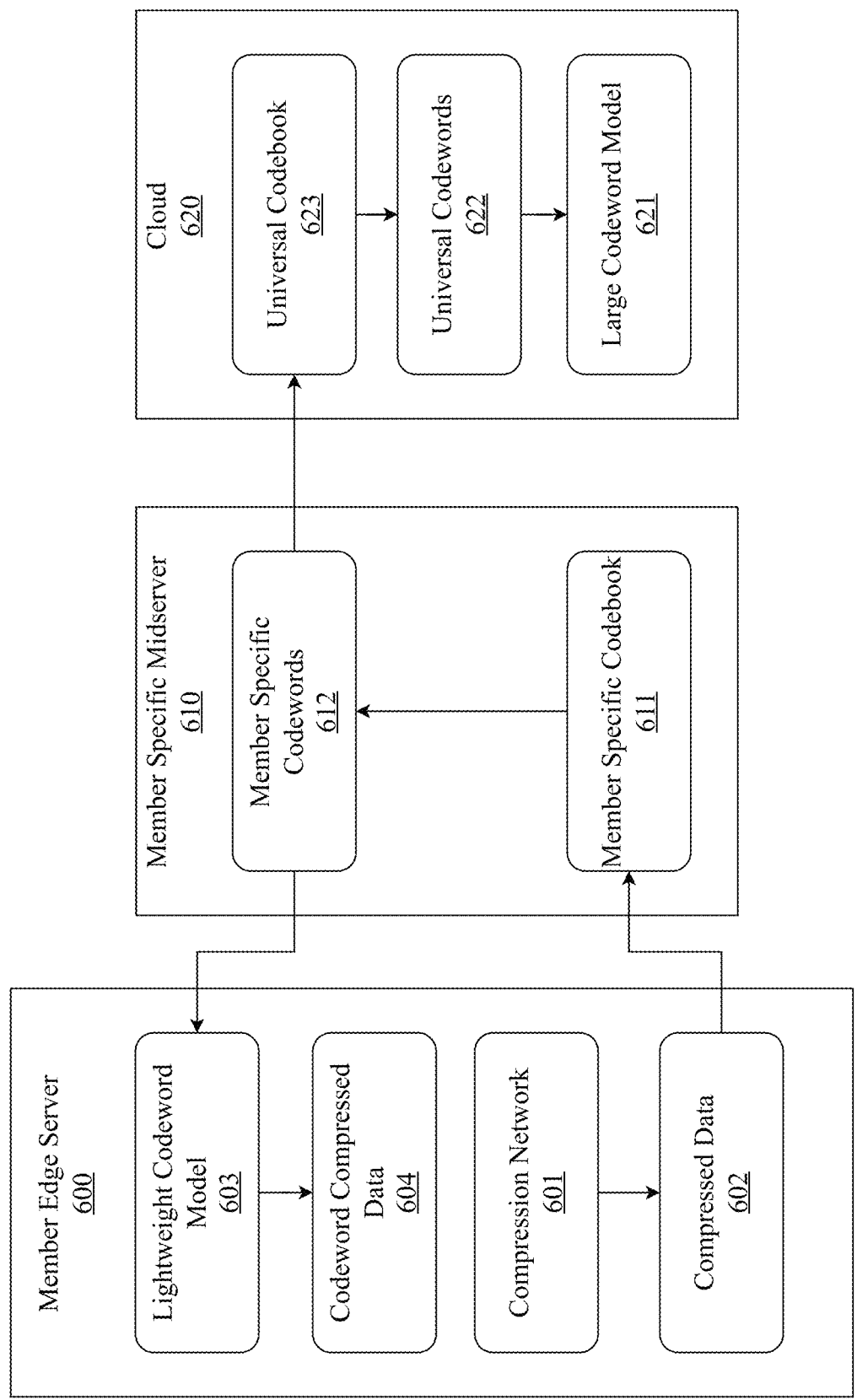
FIG. 6 is a block diagram illustrating an exemplary system architecture for a system and for federated two-stage compression with federated joint learning.

FIG. 6 is a block diagram illustrating an exemplary system architecture for a system and for federated two-stage compression with federated joint learning. Illustrated is an expanded system architecture for learning-based lossless data compression, building upon the original MLP-LSTM compression framework. The system comprises three main components: a member edge server 600, a member specific midserver 610, and a cloud 620. At the member edge server 600, a compression network 601, which may utilizes the MLP-LSTM compression technique utilized in the system for learning-based lossless data compression, processes input data to generate compressed data 602. This compressed data is then sent to the member specific midserver 610 for further processing.

The member specific midserver 610 employs a member specific codebook 611 to convert the compressed data into member specific codewords 612. These codewords represent a more compact and specialized form of the original data, tailored to the specific member's data characteristics. The member specific codewords are then relayed back to the member edge server 600, where they are used to train a lightweight codeword model 603. This model is specifically designed to handle tasks relevant to the edge server, allowing for even greater compression efficiency due to its specialized nature.

The term "lightweight codeword model" is used to describe a specialized model designed to operate efficiently on edge servers with limited computational resources. This model is considered "lightweight" because it is tailored to handle a specific, narrow set of tasks relevant to the particular edge server, rather than being a comprehensive model capable of processing a wide range of data types. The model is "codeword-based" because it operates on the codewords generated from the compressed data, which represent a more compact and efficient form of the original information.

The specialization of the lightweight codeword model to the edge server's specific data and tasks allows for greater efficiency and compression. For example, an edge server in a smart factory might have a lightweight codeword model specialized for processing sensor data from manufacturing equipment. This model would be highly efficient at compressing and analyzing data related to machine performance, temperature readings, and production metrics, but it wouldn't need to handle unrelated tasks like image recognition or natural language processing. Similarly, an edge server in an autonomous vehicle might have a lightweight codeword model optimized for processing real-time data from various sensors, cameras, and GPS systems. This model would be extremely efficient at compressing and analyzing data related to vehicle position, obstacle detection, and traffic conditions, but it wouldn't need to handle tasks irrelevant to driving. In both cases, the lightweight nature of the model, combined with its specialization to a specific set of codewords representing compressed data from a narrow domain, allows for rapid processing and highly efficient compression on resource-constrained edge devices.

In another example, an edge server in a smart home environment might use its lightweight codeword model to efficiently process and compress sensor data from various IoT devices. Another instance could be a mobile edge server utilizing its lightweight model to compress and analyze user interaction data in real-time, optimizing app performance and responsiveness.

In addition to training the lightweight model, the member specific codewords may also sent to the cloud 620 for broader analysis and model training. The cloud environment contains a universal codebook 623 that integrates the member specific codewords from various sources into a comprehensive set of universal codewords 622. These universal codewords serve as input for training a large codeword model 621 in the cloud. This larger model has broader implications and can capture patterns and insights across multiple members or data sources.

The system also allows for bidirectional flow of information. The lightweight codeword model on the edge server can be updated based on insights from the large codeword model in the cloud, ensuring that edge processing remains efficient and up-to-date. Similarly, the cloud model continuously evolves as it receives new codewords from various member specific midservers. The system is designed to support federated learning, allowing multiple member edge servers and their associated midservers to collaboratively train and improve the compression models without sharing raw data. This federated approach ensures data privacy while leveraging the collective knowledge of all participants.

In the federated learning process, each member edge server 600 trains its own version of the compression network 601 and lightweight codeword model 603 on its local data. Instead of sharing the raw data or compressed data, only the model updates (such as weights or gradients) may be sent to the cloud 620. The cloud aggregates these updates from multiple members to improve the large codeword model 621, which serves as the global model in this federated system.

The system also enables federated joint learning, where the entire pipeline—from the initial compression network to the final large codeword model—is optimized end-to-end across all participating members. This joint learning process allows the system to find the optimal balance between compression efficiency at the edge, codeword generation at the midserver, and global model performance in the cloud. During federated joint learning, the cloud 620 periodically sends updates to the member specific midservers 610 and edge servers 600. These updates help refine the member specific codebooks 611 and improve the performance of the lightweight codeword models 603 on the edge servers. This bidirectional flow of model updates ensures that each component of the system benefits from the collective learning process while maintaining the privacy of individual member data.

The federated joint learning approach also allows for personalization. While the large codeword model 621 in the cloud captures general patterns across all members, each member's lightweight codeword model 603 can be fine-tuned to its specific data distribution and tasks. This personalization improves the efficiency of edge processing while still benefiting from the broader knowledge captured in the global model.

By combining federated learning with joint optimization, this system achieves a balance between local efficiency, global performance, and data privacy. It enables collaborative learning across multiple members or organizations without the need to centralize sensitive data, making it particularly suitable for applications where data privacy and edge computing efficiency are crucial. This multi-tiered approach combines the benefits of edge computing, specialized compression, and cloud-based large-scale modeling. It enables efficient data processing and compression at the edge, while also facilitating broader analysis and model development in the cloud, all while maintaining data privacy through the use of codewords rather than raw data.

Figure 7:
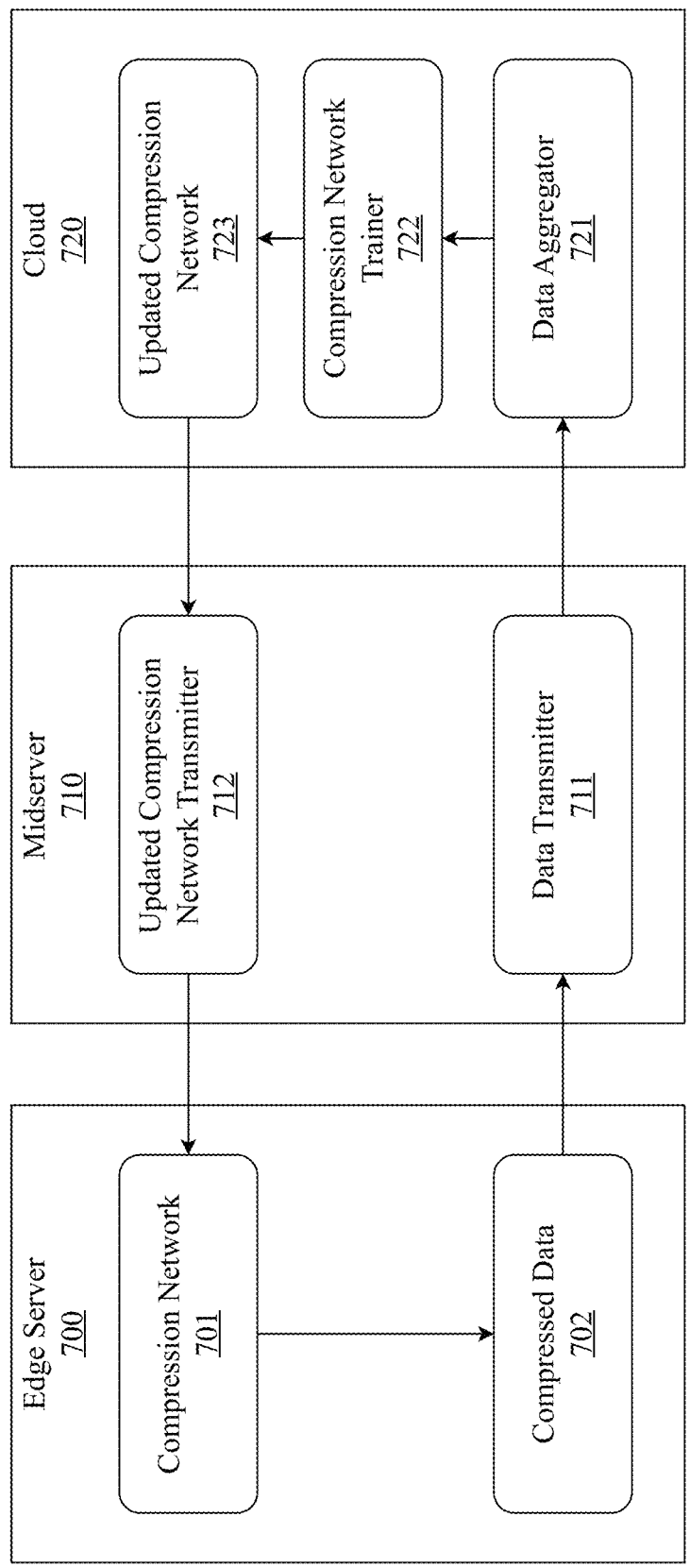
FIG. 7 is a block diagram illustrating an exemplary system architecture for a trainable compression network on an edge server.

FIG. 7 is a block diagram illustrating an exemplary system architecture for a trainable compression network on an edge server. Depicted is a training cycle for a learning-based lossless data compression system, comprising three main components: an edge server 700, a midserver 710, and a cloud environment 720. This system demonstrates how compressed data from the edge is used to update the compression model, which is then redistributed back to the edge.

At the edge server 700, a compression network 701 processes input data to generate compressed data 702. The compression network may utilizes advanced techniques such as the MLP-LSTM framework disclosed in the lossless data compression system. The compressed data 702 represents a compact form of the original information, optimized for efficient storage and transmission.

The compressed data 702 is then sent to the midserver 710, which acts as an intermediary between the edge and the cloud. The midserver contains a data transmitter 711 that securely forwards the compressed data to the cloud environment. This transmission step ensures that only the compressed form of the data, rather than raw information, leaves the edge server, enhancing data privacy and reducing bandwidth requirements. In the cloud environment 720, a data aggregator 721 collects compressed data from multiple sources, potentially including various edge servers and midservers. This aggregated data serves as input for the compression network trainer 722. The trainer analyzes the compressed data to identify patterns, inefficiencies, or areas for improvement in the current compression model.

Based on this analysis, the compression network trainer 722 updates the existing model, producing an updated compression network 723. This updated network incorporates learnings from the aggregated compressed data, potentially improving compression efficiency, accuracy, or adaptability to different types of input data. The updated compression network 723 is then sent back to the midserver 710, where an updated compression network transmitter 712 manages its secure distribution back to the edge server 700. Once received, the edge server can replace its existing compression network 701 with the updated version, completing the training cycle.

This cyclical process allows for continuous improvement of the compression model based on real-world data. By aggregating compressed data from multiple sources in the cloud, the system can learn from a diverse range of inputs, potentially leading to a more robust and efficient compression network. At the same time, by only transmitting compressed data and updated models, rather than raw data, the system maintains a high level of data privacy and efficiency. The use of a midserver 710 as an intermediary adds an extra layer of security and control, potentially allowing for additional data processing or filtering steps between the edge and the cloud. This architecture also provides flexibility, as the midserver could be tailored to specific organizational needs or regulatory requirements.

Figure 8:
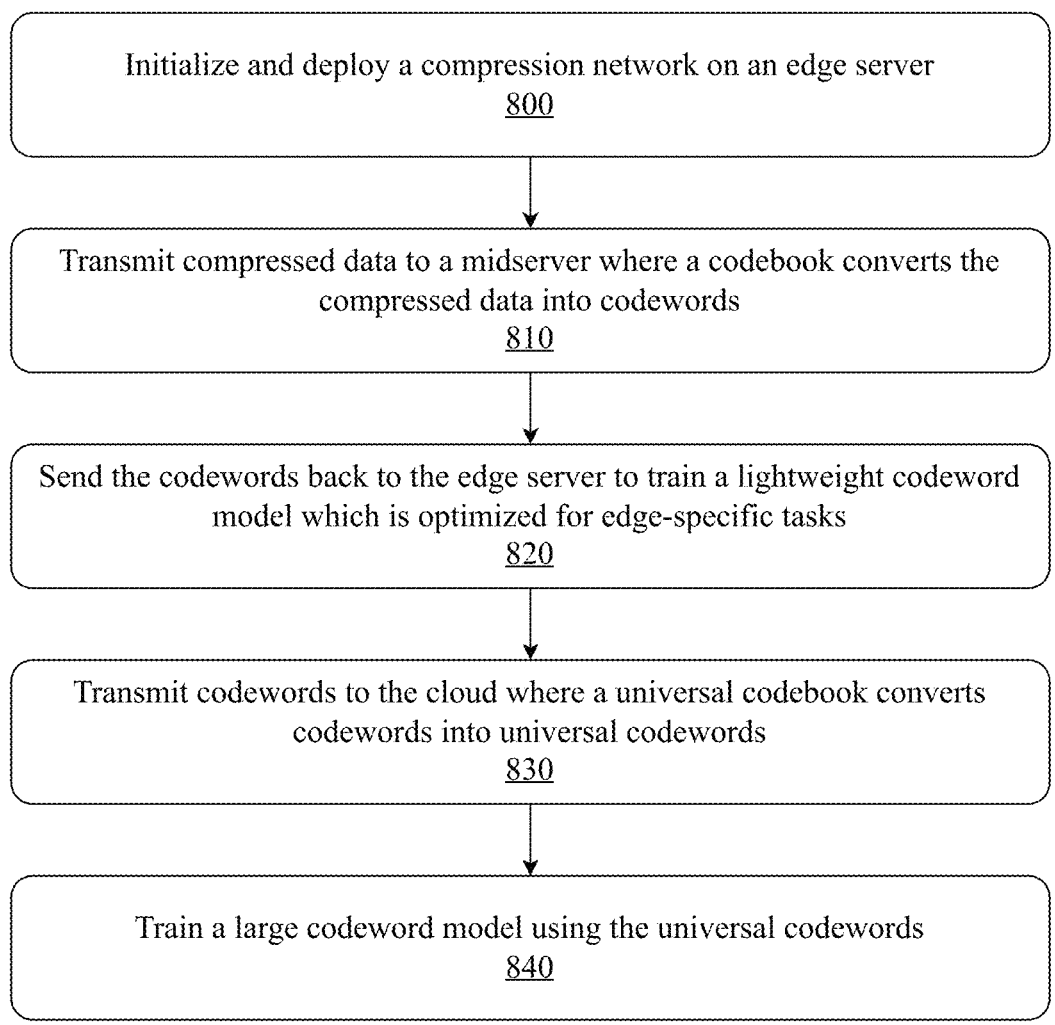
FIG. 8 is a flow diagram illustrating an exemplary method for federated two-state compression with federated joint learning.

FIG. 8 is a flow diagram illustrating an exemplary method for federated two-state compression with federated joint learning. In a first step 800, a compression network is initialized and deployed on an edge server. This step involves setting up the initial architecture of the compression network, which could be based on the MLP-LSTM framework mentioned in the original patent. The network is configured to efficiently compress data specific to the edge server's tasks. For example, in a smart home system, this network might be optimized to compress data from various IoT devices such as thermostats, security cameras, and energy meters.

In a step 810, the compressed data is transmitted to a midserver where a codebook converts the compressed data into codewords. This step involves sending the output of the compression network to a separate server that acts as an intermediary. The midserver uses a predefined codebook to transform the compressed data into a series of codewords. These codewords represent a more compact form of the data, further reducing its size while maintaining its essential information. For instance, in our smart home example, a sequence of compressed temperature readings might be converted into a single codeword representing a specific temperature pattern.

In a step 820, the codewords are sent back to the edge server to train a lightweight codeword model which is optimized for edge-specific tasks. This step is crucial for improving the efficiency of edge processing. The lightweight model learns to interpret and work directly with the codewords, allowing for faster processing and decision-making at the edge. In our smart home scenario, this model might learn to quickly identify unusual temperature patterns or predict energy usage based on the codewords, without needing to decompress the full data.

In a step 830, the codewords are transmitted to the cloud where a universal codebook converts them into universal codewords. This step broadens the scope of the data representation. The universal codebook in the cloud can interpret codewords from multiple sources and convert them into a standardized format. For example, it might convert temperature pattern codewords from various smart home systems into universal codewords that represent general climate trends.

In a step 840, a large codeword model is trained using the universal codewords. This step involves using the standardized, universal codewords to train a more comprehensive model in the cloud. This model can capture broader patterns and insights across multiple edge servers or even different types of systems. In the ongoing example, this large model might learn to identify correlations between temperature patterns, energy usage, and other factors across many smart homes, potentially leading to improved energy management strategies or predictive maintenance for HVAC systems.

Figure 9:
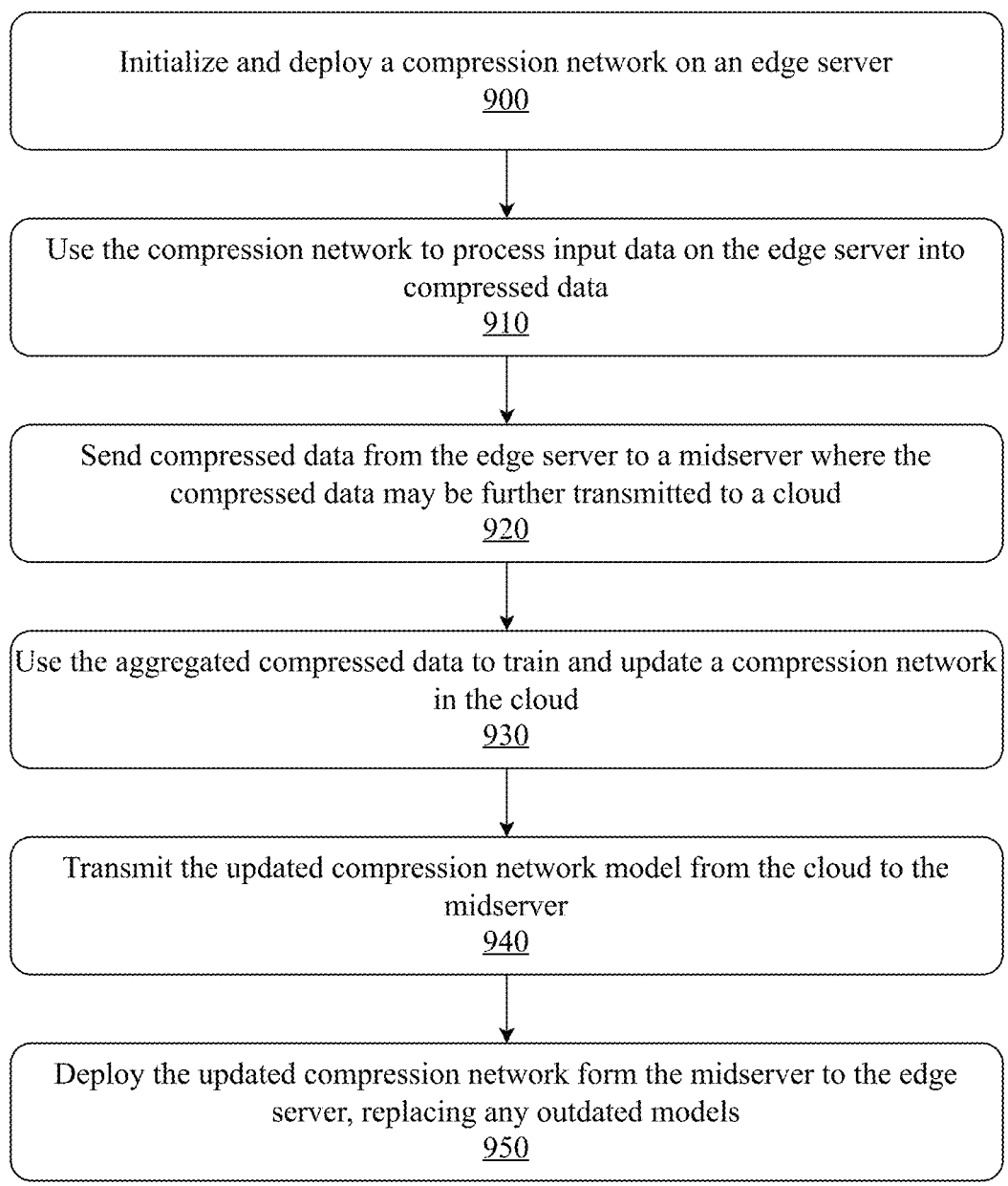
FIG. 9 is a flow diagram illustrating an exemplary method for a training and utilizing a compression network on an edge server.

FIG. 9 is a flow diagram illustrating an exemplary method for a training and utilizing a compression network on an edge server. In a first step 900, a compression network is initialized and deployed on an edge server. This step involves setting up the initial architecture of the compression network, which could be based on advanced techniques such as the MLP-LSTM framework. The network is configured to efficiently compress data specific to the edge server's tasks and environment. For instance, in a smart city traffic management system, this network might be optimized to compress data from traffic cameras, speed sensors, and vehicle counters.

In a step 910, the compression network is used to process input data on the edge server, generating compressed data. This step involves applying the current version of the compression network to incoming data streams, reducing their size while preserving essential information. In the smart city example, the network might compress real-time traffic flow data, reducing high-resolution video feeds to key metrics like vehicle count, average speed, and lane occupancy.

In a step 920, the compressed data is sent from the edge server to a midserver where it may be further transmitted to a cloud. The midserver acts as an intermediary, facilitating secure and efficient data transfer between the edge and the cloud. This step ensures that only compressed, privacy-preserving data leaves the edge environment. In the traffic management scenario, the midserver might aggregate compressed data from multiple intersections before sending it to the cloud.

In a step 930, the aggregated compressed data is used to train and update a compression network in the cloud. A compression network trainer in the cloud analyzes the collected data from multiple sources, identifying patterns and areas for improvement in the current model. For the smart city example, this might involve learning new patterns in traffic flow across different times of day, weather conditions, or special events, allowing the model to more efficiently compress and represent these scenarios.

In a step 940, the updated compression network model is transmitted from the cloud back to the midserver. This step involves securely sending the newly trained model through the network for distribution to edge servers. The updated model incorporates learnings from a wide range of data sources, potentially improving its ability to compress diverse types of traffic data more efficiently. In a step 950, the updated compression network is deployed from the midserver to the edge server, replacing any outdated models. This completes the training cycle, with the edge server now using an improved model based on aggregated data from multiple sources. In our traffic management system, this could result in more efficient compression of traffic data, potentially allowing for real-time analysis of more data streams or freeing up computational resources for other tasks.

This cyclical process allows for continuous improvement of the compression model, leveraging both edge and cloud computing resources to optimize performance and efficiency over time. It enables the system to adapt to changing data patterns and improve its compression capabilities without requiring manual intervention at each edge server. The use of midservers adds an extra layer of security and control, potentially allowing for additional data processing or filtering steps between the edge and the cloud.

Exemplary Computing Environment

Figure 10:
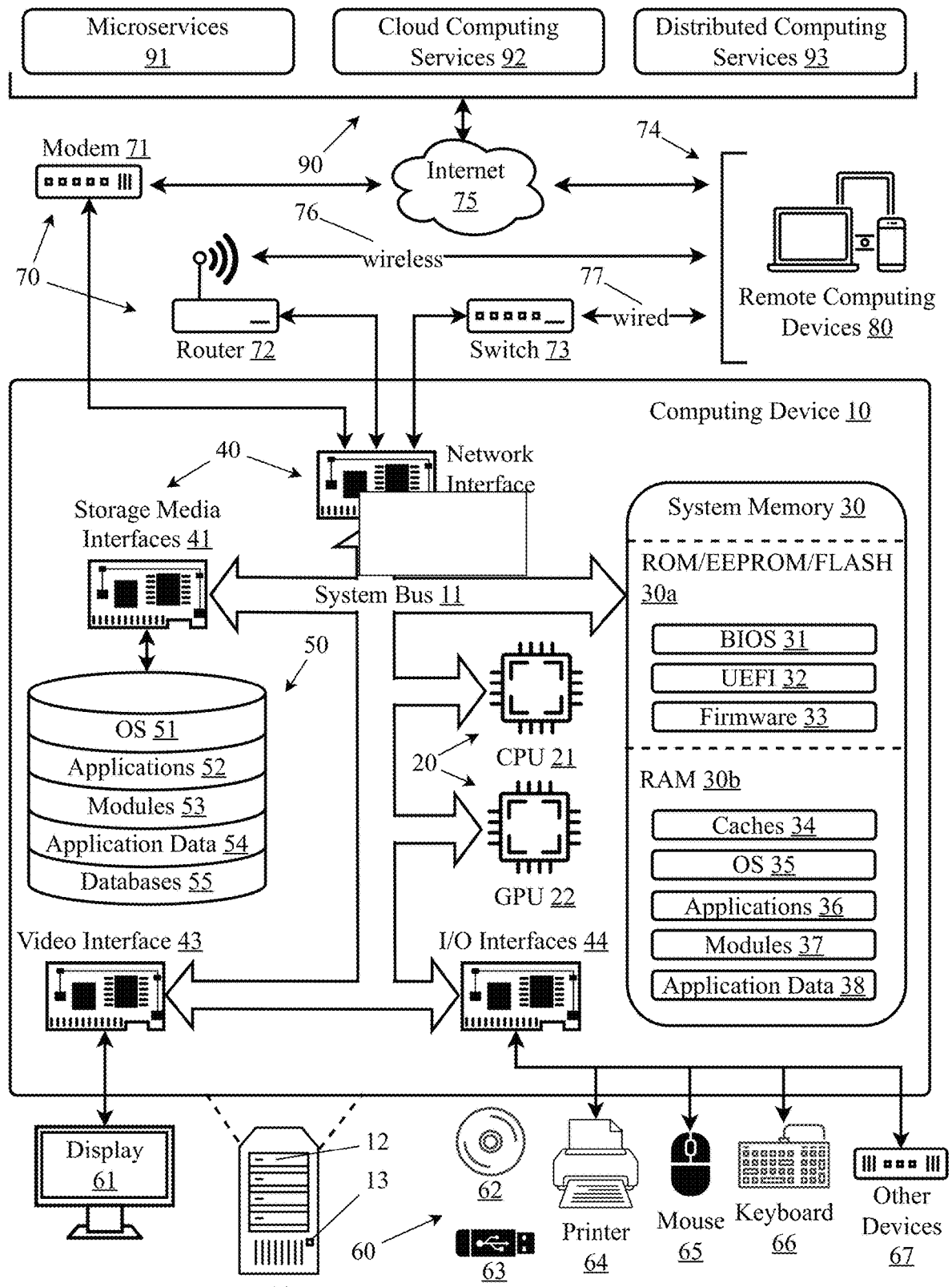
FIG. 10 illustrates an exemplary computing environment on which an embodiment described herein may be implemented, in full or in part.

FIG. 10 illustrates an exemplary computing environment on which an embodiment described herein may be implemented, in full or in part. This exemplary computing environment describes computer-related components and processes supporting enabling disclosure of computer-implemented embodiments. Inclusion in this exemplary computing environment of well-known processes and computer components, if any, is not a suggestion or admission that any embodiment is no more than an aggregation of such processes or components. Rather, implementation of an embodiment using processes and components described in this exemplary computing environment will involve programming or configuration of such processes and components resulting in a machine specially programmed or configured for such implementation. The exemplary computing environment described herein is only one example of such an environment and other configurations of the components and processes are possible, including other relationships between and among components, and/or absence of some processes or components described. Further, the exemplary computing environment described herein is not intended to suggest any limitation as to the scope of use or functionality of any embodiment implemented, in whole or in part, on components or processes described herein.

The exemplary computing environment described herein comprises a computing device 10 (further comprising a system bus 11, one or more processors 20, a system memory 30, one or more interfaces 40, one or more non-volatile data storage devices 50), external peripherals and accessories 60, external communication devices 70, remote computing devices 80, and cloud-based services 90.

System bus 11 couples the various system components, coordinating operation of and data transmission between those various system components. System bus 11 represents one or more of any type or combination of types of wired or wireless bus structures including, but not limited to, memory busses or memory controllers, point-to-point connections, switching fabrics, peripheral busses, accelerated graphics ports, and local busses using any of a variety of bus architectures. By way of example, such architectures include, but are not limited to, Industry Standard Architecture (ISA) busses, Micro Channel Architecture (MCA) busses, Enhanced ISA (EISA) busses, Video Electronics Standards Association (VESA) local busses, a Peripheral Component Interconnects (PCI) busses also known as a Mezzanine busses, or any selection of, or combination of, such busses. Depending on the specific physical implementation, one or more of the processors 20, system memory 30 and other components of the computing device 10 can be physically co-located or integrated into a single physical component, such as on a single chip. In such a case, some or all of system bus 11 can be electrical pathways within a single chip structure.

Computing device may further comprise externally-accessible data input and storage devices 12 such as compact disc read-only memory (CD-ROM) drives, digital versatile discs (DVD), or other optical disc storage for reading and/or writing optical discs 62; magnetic cassettes, magnetic tape, magnetic disk storage, or other magnetic storage devices; or any other medium which can be used to store the desired content and which can be accessed by the computing device 10. Computing device may further comprise externally-accessible data ports or connections 12 such as serial ports, parallel ports, universal serial bus (USB) ports, and infrared ports and/or transmitter/receivers. Computing device may further comprise hardware for wireless communication with external devices such as IEEE 1394 ("Firewire") interfaces, IEEE 802.11 wireless interfaces, BLUETOOTH® wireless interfaces, and so forth. Such ports and interfaces may be used to connect any number of external peripherals and accessories 60 such as visual displays, monitors, and touch-sensitive screens 61, USB solid state memory data storage drives (commonly known as "flash drives" or "thumb drives") 63, printers 64, pointers and manipulators such as mice 65, keyboards 66, and other devices 67 such as joysticks and gaming pads, touchpads, additional displays and monitors, and external hard drives (whether solid state or disc-based), microphones, speakers, cameras, and optical scanners.

Processors 20 are logic circuitry capable of receiving programming instructions and processing (or executing) those instructions to perform computer operations such as retrieving data, storing data, and performing mathematical calculations. Processors 20 are not limited by the materials from which they are formed or the processing mechanisms employed therein, but are typically comprised of semiconductor materials into which many transistors are formed together into logic gates on a chip (i.e., an integrated circuit or IC). The term processor includes any device capable of receiving and processing instructions including, but not limited to, processors operating on the basis of quantum computing, optical computing, mechanical computing (e.g., using nanotechnology entities to transfer data), and so forth. Depending on configuration, computing device 10 may comprise more than one processor. For example, computing device 10 may comprise one or more central processing units (CPUs) 21, each of which itself has multiple processors or multiple processing cores, each capable of independently or semi-independently processing programming instructions based on technologies like complex instruction set computer (CISC) or reduced instruction set computer (RISC). Further, computing device 10 may comprise one or more specialized processors such as a graphics processing unit (GPU) 22 configured to accelerate processing of computer graphics and images via a large array of specialized processing cores arranged in parallel. Further computing device 10 may be comprised of one or more specialized processes such as Intelligent Processing Units, field-programmable gate arrays or application-specific integrated circuits for specific tasks or types of tasks. The term processor may further include: neural processing units (NPUs) or neural computing units optimized for machine learning and artificial intelligence workloads using specialized architectures and data paths;

tensor processing units (TPUs) designed to efficiently perform matrix multiplication and convolution operations used heavily in neural networks and deep learning applications; application-specific integrated circuits (ASICs) implementing custom logic for domain-specific tasks; application-specific instruction set processors (ASIPs) with instruction sets tailored for particular applications; field-programmable gate arrays (FPGAs) providing reconfigurable logic fabric that can be customized for specific processing tasks; processors operating on emerging computing paradigms such as quantum computing, optical computing, mechanical computing (e.g., using nanotechnology entities to transfer data), and so forth. Depending on configuration, computing device 10 may comprise one or more of any of the above types of processors in order to efficiently handle a variety of general purpose and specialized computing tasks. The specific processor configuration may be selected based on performance, power, cost, or other design constraints relevant to the intended application of computing device 10.

System memory 30 is processor-accessible data storage in the form of volatile and/or nonvolatile memory. System memory 30 may be either or both of two types: non-volatile memory and volatile memory. Non-volatile memory 30a is not erased when power to the memory is removed, and includes memory types such as read only memory (ROM), electronically-erasable programmable memory (EEPROM), and rewritable solid state memory (commonly known as "flash memory"). Non-volatile memory 30a is typically used for long-term storage of a basic input/output system (BIOS) 31, containing the basic instructions, typically loaded during computer startup, for transfer of information between components within computing device, or a unified extensible firmware interface (UEFI), which is a modern replacement for BIOS that supports larger hard drives, faster boot times, more security features, and provides native support for graphics and mouse cursors. Non-volatile memory 30a may also be used to store firmware comprising a complete operating system 35 and applications 36 for operating computer-controlled devices. The firmware approach is often used for purpose-specific computer-controlled devices such as appliances and Internet-of-Things (IoT) devices where processing power and data storage space is limited. Volatile memory 30b is erased when power to the memory is removed and is typically used for short-term storage of data for processing. Volatile memory 30b includes memory types such as random-access memory (RAM), and is normally the primary operating memory into which the operating system 35, applications 36, program modules 37, and application data 38 are loaded for execution by processors 20. Volatile memory 30b is generally faster than non-volatile memory 30a due to its electrical characteristics and is directly accessible to processors 20 for processing of instructions and data storage and retrieval. Volatile memory 30b may comprise one or more smaller cache memories which operate at a higher clock speed and are typically placed on the same IC as the processors to improve performance.

There are several types of computer memory, each with its own characteristics and use cases. System memory 30 may be configured in one or more of the several types described herein, including high bandwidth memory (HBM) and advanced packaging technologies like chip-on-wafer-on-substrate (CoWoS). Static random access memory (SRAM) provides fast, low-latency memory used for cache memory in processors, but is more expensive and consumes more power compared to dynamic random access memory (DRAM). SRAM retains data as long as power is supplied. DRAM is the main memory in most computer systems and is slower than SRAM but cheaper and more dense. DRAM requires periodic refresh to retain data. NAND flash is a type of non-volatile memory used for storage in solid state drives (SSDs) and mobile devices and provides high density and lower cost per bit compared to DRAM with the trade-off of slower write speeds and limited write endurance. HBM is an emerging memory technology that provides high bandwidth and low power consumption which stacks multiple DRAM dies vertically, connected by through-silicon vias (TSVs). HBM offers much higher bandwidth (up to 1 TB/s) compared to traditional DRAM and may be used in high-performance graphics cards, AI accelerators, and edge computing devices. Advanced packaging and CoWoS are technologies that enable the integration of multiple chips or dies into a single package. CoWoS is a 2.5D packaging technology that interconnects multiple dies side-by-side on a silicon interposer and allows for higher bandwidth, lower latency, and reduced power consumption compared to traditional PCB-based packaging. This technology enables the integration of heterogeneous dies (e.g., CPU, GPU, HBM) in a single package and may be used in high-performance computing, AI accelerators, and edge computing devices.

Interfaces 40 may include, but are not limited to, storage media interfaces 41, network interfaces 42, display interfaces 43, and input/output interfaces 44. Storage media interface 41 provides the necessary hardware interface for loading data from non-volatile data storage devices 50 into system memory 30 and storage data from system memory 30 to non-volatile data storage device 50. Network interface 42 provides the necessary hardware interface for computing device 10 to communicate with remote computing devices 80 and cloud-based services 90 via one or more external communication devices 70. Display interface 43 allows for connection of displays 61, monitors, touchscreens, and other visual input/output devices. Display interface 43 may include a graphics card for processing graphics-intensive calculations and for handling demanding display requirements. Typically, a graphics card includes a graphics processing unit (GPU) and video RAM (VRAM) to accelerate display of graphics. In some high-performance computing systems, multiple GPUs may be connected using NVLink bridges, which provide high-bandwidth, low-latency interconnects between GPUs. NVLink bridges enable faster data transfer between GPUs, allowing for more efficient parallel processing and improved performance in applications such as machine learning, scientific simulations, and graphics rendering. One or more input/output (I/O) interfaces 44 provide the necessary support for communications between computing device 10 and any external peripherals and accessories 60. For wireless communications, the necessary radio-frequency hardware and firmware may be connected to I/O interface 44 or may be integrated into I/O interface 44. Network interface 42 may support various communication standards and protocols, such as Ethernet and Small Form-Factor Pluggable (SFP). Ethernet is a widely used wired networking technology that enables local area network (LAN) communication. Ethernet interfaces typically use RJ45 connectors and support data rates ranging from 10 Mbps to 100 Gbps, with common speeds being 100 Mbps, 1 Gbps, 10 Gbps, 25 Gbps, 40 Gbps, and 100 Gbps. Ethernet is known for its reliability, low latency, and cost-effectiveness, making it a popular choice for home, office, and data center networks. SFP is a compact, hot-pluggable transceiver used for both telecommunication and data communications applications. SFP interfaces provide a modular and flexible solution for connecting network devices, such as switches and routers, to fiber optic or copper networking cables. SFP transceivers support various data rates, ranging from 100 Mbps to 100 Gbps, and can be easily replaced or upgraded without the need to replace the entire network interface card. This modularity allows for network scalability and adaptability to different network requirements and fiber types, such as single-mode or multi-mode fiber.

Non-volatile data storage devices 50 are typically used for long-term storage of data. Data on non-volatile data storage devices 50 is not erased when power to the non-volatile data storage devices 50 is removed. Non-volatile data storage devices 50 may be implemented using any technology for non-volatile storage of content including, but not limited to, CD-ROM drives, digital versatile discs (DVD), or other optical disc storage; magnetic cassettes, magnetic tape, magnetic disc storage, or other magnetic storage devices; solid state memory technologies such as EEPROM or flash memory; or other memory technology or any other medium which can be used to store data without requiring power to retain the data after it is written. Non-volatile data storage devices 50 may be non-removable from computing device 10 as in the case of internal hard drives, removable from computing device 10 as in the case of external USB hard drives, or a combination thereof, but computing device will typically comprise one or more internal, non-removable hard drives using either magnetic disc or solid state memory technology. Non-volatile data storage devices 50 may be implemented using various technologies, including hard disk drives (HDDs) and solid-state drives (SSDs). HDDs use spinning magnetic platters and read/write heads to store and retrieve data, while SSDs use NAND flash memory. SSDs offer faster read/write speeds, lower latency, and better durability due to the lack of moving parts, while HDDs typically provide higher storage capacities and lower cost per gigabyte. NAND flash memory comes in different types, such as Single-Level Cell (SLC), Multi-Level Cell (MLC), Triple-Level Cell (TLC), and Quad-Level Cell (QLC), each with trade-offs between performance, endurance, and cost. Storage devices connect to the computing device 10 through various interfaces, such as SATA, NVMe, and PCIe. SATA is the traditional interface for HDDs and SATA SSDs, while NVMe (Non-Volatile Memory Express) is a newer, high-performance protocol designed for SSDs connected via PCIe. PCIe SSDs offer the highest performance due to the direct connection to the PCIe bus, bypassing the limitations of the SATA interface. Other storage form factors include M.2 SSDs, which are compact storage devices that connect directly to the motherboard using the M.2 slot, supporting both SATA and NVMe interfaces.

Additionally, technologies like Intel Optane memory combine 3D XPoint technology with NAND flash to provide high-performance storage and caching solutions. Non-volatile data storage devices 50 may be non-removable from computing device 10, as in the case of internal hard drives, removable from computing device 10, as in the case of external USB hard drives, or a combination thereof. However, computing devices will typically comprise one or more internal, non-removable hard drives using either magnetic disc or solid-state memory technology. Non-volatile data storage devices 50 may store any type of data including, but not limited to, an operating system 51 for providing low-level and mid-level functionality of computing device 10, applications 52 for providing high-level functionality of computing device 10, program modules 53 such as containerized programs or applications, or other modular content or modular programming, application data 54, and databases 55 such as relational databases, non-relational databases, object oriented databases, NoSQL databases, vector databases, knowledge graph databases, key-value databases, document oriented data stores, and graph databases.

Applications (also known as computer software or software applications) are sets of programming instructions designed to perform specific tasks or provide specific functionality on a computer or other computing devices. Applications are typically written in high-level programming languages such as C, C++, Scala, Erlang, GoLang, Java, Scala, Rust, and Python, which are then either interpreted at runtime or compiled into low-level, binary, processor-executable instructions operable on processors 20. Applications may be containerized so that they can be run on any computer hardware running any known operating system.

Containerization of computer software is a method of packaging and deploying applications along with their operating system dependencies into self-contained, isolated units known as containers. Containers provide a lightweight and consistent runtime environment that allows applications to run reliably across different computing environments, such as development, testing, and production systems facilitated by specifications such as containerd.

The memories and non-volatile data storage devices described herein do not include communication media. Communication media are means of transmission of information such as modulated electromagnetic waves or modulated data signals configured to transmit, not store, information. By way of example, and not limitation, communication media includes wired communications such as sound signals transmitted to a speaker via a speaker wire, and wireless communications such as acoustic waves, radio frequency (RF) transmissions, infrared emissions, and other wireless media.

External communication devices 70 are devices that facilitate communications between computing device and either remote computing devices 80, or cloud-based services 90, or both. External communication devices 70 include, but are not limited to, data modems 71 which facilitate data transmission between computing device and the Internet 75 via a common carrier such as a telephone company or internet service provider (ISP), routers 72 which facilitate data transmission between computing device and other devices, and switches 73 which provide direct data communications between devices on a network or optical transmitters (e.g., lasers). Here, modem 71 is shown connecting computing device 10 to both remote computing devices 80 and cloud-based services 90 via the Internet 75. While modem 71, router 72, and switch 73 are shown here as being connected to network interface 42, many different network configurations using external communication devices 70 are possible. Using external communication devices 70, networks may be configured as local area networks (LANs) for a single location, building, or campus, wide area networks (WANs) comprising data networks that extend over a larger geographical area, and virtual private networks (VPNs) which can be of any size but connect computers via encrypted communications over public networks such as the Internet 75. As just one exemplary network configuration, network interface 42 may be connected to switch 73 which is connected to router 72 which is connected to modem 71 which provides access for computing device 10 to the Internet 75. Further, any combination of wired 77 or wireless 76 communications between and among computing device 10, external communication devices 70, remote computing devices 80, and cloud-based services 90 may be used. Remote computing devices 80, for example, may communicate with computing device through a variety of communication channels 74 such as through switch 73 via a wired 77 connection, through router 72 via a wireless connection 76, or through modem 71 via the Internet 75. Furthermore, while not shown here, other hardware that is specifically designed for servers or networking functions may be employed. For example, secure socket layer (SSL) acceleration cards can be used to offload SSL encryption computations, and transmission control protocol/internet protocol (TCP/IP) offload hardware and/or packet classifiers on network interfaces 42 may be installed and used at server devices or intermediate networking equipment (e.g., for deep packet inspection).

In a networked environment, certain components of computing device 10 may be fully or partially implemented on remote computing devices 80 or cloud-based services 90. Data stored in non-volatile data storage device 50 may be received from, shared with, duplicated on, or offloaded to a non-volatile data storage device on one or more remote computing devices 80 or in a cloud computing service 92. Processing by processors 20 may be received from, shared with, duplicated on, or offloaded to processors of one or more remote computing devices 80 or in a distributed computing service 93. By way of example, data may reside on a cloud computing service 92, but may be usable or otherwise accessible for use by computing device 10. Also, certain processing subtasks may be sent to a microservice 91 for processing with the result being transmitted to computing device 10 for incorporation into a larger processing task. Also, while components and processes of the exemplary computing environment are illustrated herein as discrete units (e.g., OS 51 being stored on non-volatile data storage device 51 and loaded into system memory 35 for use) such processes and components may reside or be processed at various times in different components of computing device 10, remote computing devices 80, and/or cloud-based services 90. Also, certain processing subtasks may be sent to a microservice 91 for processing with the result being transmitted to computing device 10 for incorporation into a larger processing task. Infrastructure as Code (IaaC) tools like Terraform can be used to manage and provision computing resources across multiple cloud providers or hyperscalers. This allows for workload balancing based on factors such as cost, performance, and availability. For example, Terraform can be used to automatically provision and scale resources on AWS spot instances during periods of high demand, such as for surge rendering tasks, to take advantage of lower costs while maintaining the required performance levels. In the context of rendering, tools like Blender can be used for object rendering of specific elements, such as a car, bike, or house. These elements can be approximated and roughed in using techniques like bounding box approximation or low-poly modeling to reduce the computational resources required for initial rendering passes. The rendered elements can then be integrated into the larger scene or environment as needed, with the option to replace the approximated elements with higher-fidelity models as the rendering process progresses.

In an implementation, the disclosed systems and methods may utilize, at least in part, containerization techniques to execute one or more processes and/or steps disclosed herein. Containerization is a lightweight and efficient virtualization technique that allows you to package and run applications and their dependencies in isolated environments called containers. One of the most popular containerization platforms is containerd, which is widely used in software development and deployment. Containerization, particularly with open-source technologies like containerd and container orchestration systems like Kubernetes, is a common approach for deploying and managing applications. Containers are created from images, which are lightweight, standalone, and executable packages that include application code, libraries, dependencies, and runtime. Images are often built from a containerfile or similar, which contains instructions for assembling the image. Containerfiles are configuration files that specify how to build a container image. Systems like Kubernetes natively support containerd as a container runtime. They include commands for installing dependencies, copying files, setting environment variables, and defining runtime configurations. Container images can be stored in repositories, which can be public or private. Organizations often set up private registries for security and version control using tools such as Harbor, JFrog Artifactory and Bintray, GitLab Container Registry, or other container registries. Containers can communicate with each other and the external world through networking. Containerd provides a default network namespace, but can be used with custom network plugins. Containers within the same network can communicate using container names or IP addresses.

Remote computing devices 80 are any computing devices not part of computing device 10. Remote computing devices 80 include, but are not limited to, personal computers, server computers, thin clients, thick clients, personal digital assistants (PDAs), mobile telephones, watches, tablet computers, laptop computers, multiprocessor systems, microprocessor based systems, set-top boxes, programmable consumer electronics, video game machines, game consoles, portable or handheld gaming units, network terminals, desktop personal computers (PCs), minicomputers, mainframe computers, network nodes, virtual reality or augmented reality devices and wearables, and distributed or multi-processing computing environments. While remote computing devices 80 are shown for clarity as being separate from cloud-based services 90, cloud-based services 90 are implemented on collections of networked remote computing devices 80.

Cloud-based services 90 are Internet-accessible services implemented on collections of networked remote computing devices 80. Cloud-based services are typically accessed via application programming interfaces (APIs) which are software interfaces which provide access to computing services within the cloud-based service via API calls, which are pre-defined protocols for requesting a computing service and receiving the results of that computing service. While cloud-based services may comprise any type of computer processing or storage, three common categories of cloud-based services 90 are serverless logic apps, microservices 91, cloud computing services 92, and distributed computing services 93.

Microservices 91 are collections of small, loosely coupled, and independently deployable computing services. Each microservice represents a specific computing functionality and runs as a separate process or container. Microservices promote the decomposition of complex applications into smaller, manageable services that can be developed, deployed, and scaled independently. These services communicate with each other through well-defined application programming interfaces (APIs), typically using lightweight protocols like HTTP, protobuffers, gRPC or message queues such as Kafka. Microservices 91 can be combined to perform more complex or distributed processing tasks. In an embodiment, Kubernetes clusters with containerized resources are used for operational packaging of system.

Cloud computing services 92 are delivery of computing resources and services over the Internet 75 from a remote location. Cloud computing services 92 provide additional computer hardware and storage on as-needed or subscription basis. Cloud computing services 92 can provide large amounts of scalable data storage, access to sophisticated software and powerful server-based processing, or entire computing infrastructures and platforms. For example, cloud computing services can provide virtualized computing resources such as virtual machines, storage, and networks, platforms for developing, running, and managing applications without the complexity of infrastructure management, and complete software applications over public or private networks or the Internet on a subscription or alternative licensing basis, or consumption or ad-hoc marketplace basis, or combination thereof.

Distributed computing services 93 provide large-scale processing using multiple interconnected computers or nodes to solve computational problems or perform tasks collectively. In distributed computing, the processing and storage capabilities of multiple machines are leveraged to work together as a unified system. Distributed computing services are designed to address problems that cannot be efficiently solved by a single computer or that require large-scale computational power or support for highly dynamic compute, transport or storage resource variance or uncertainty over time requiring scaling up and down of constituent system resources. These services enable parallel processing, fault tolerance, and scalability by distributing tasks across multiple nodes.

Although described above as a physical device, computing device 10 can be a virtual computing device, in which case the functionality of the physical components herein described, such as processors 20, system memory 30, network interfaces 40, NVLink or other GPU-to-GPU high bandwidth communications links and other like components can be provided by computer-executable instructions. Such computer-executable instructions can execute on a single physical computing device, or can be distributed across multiple physical computing devices, including being distributed across multiple physical computing devices in a dynamic manner such that the specific, physical computing devices hosting such computer-executable instructions can dynamically change over time depending upon need and availability. In the situation where computing device 10 is a virtualized device, the underlying physical computing devices hosting such a virtualized computing device can, themselves, comprise physical components analogous to those described above, and operating in a like manner. Furthermore, virtual computing devices can be utilized in multiple layers with one virtual computing device executing within the construct of another virtual computing device. Thus, computing device 10 may be either a physical computing device or a virtualized computing device within which computer-executable instructions can be executed in a manner consistent with their execution by a physical computing device. Similarly, terms referring to physical components of the computing device, as utilized herein, mean either those physical components or virtualizations thereof performing the same or equivalent functions.

The skilled person will be aware of a range of possible modifications of the various aspects described above. Accordingly, the present invention is defined by the claims and their equivalents.

What is claimed is:

1. A system for federated two-stage compression with federated joint learning, comprising one or more computers with executable instructions that, when executed, cause the system to:
   process input data through a compression network on an edge server to generate a plurality of compressed data;
   transmit the plurality of compressed data to a midserver, wherein the midserver converts the plurality of compressed data into a plurality of codewords using a codebook;
   train and deploy a lightweight codeword model on the edge server wherein the lightweight codeword model is trained using the plurality of codewords; and
   compress the input data through the lightweight codeword model on the edge server to generate a second plurality of compressed data.

2. The system of claim 1, wherein the plurality of codewords are transmitted to a cloud that converts the plurality of codewords into a plurality of codewords using a universal codebook.

3. The system of claim 2, wherein the plurality of universal codewords are used to train a large codeword model.

4. The system of claim 2, wherein updated models of the lightweight codeword model or the compression network may be stored in and transferred between the edge server, the midserver, and the cloud.

5. The system of claim 1, wherein a plurality of codebooks may be stored on the midserver and used to generate codewords for a plurality of edge servers, wherein each edge server has its own specific set of codewords.

6. A method for federated two-stage compression with federated joint learning, comprising the steps of:
   processing input data through a compression network on an edge server to generate a plurality of compressed data;
   transmitting the plurality of compressed data to a midserver, wherein the midserver converts the plurality of compressed data into a plurality of codewords using a codebook;
   training and deploy a lightweight codeword model on the edge server wherein the lightweight codeword model is trained using the plurality of codewords; and
   compressing the input data through the lightweight codeword model on the edge server to generate a second plurality of compressed data.

7. The method of claim 6, wherein the plurality of codewords are transmitted to a cloud that converts the plurality of codewords into a plurality of codewords using a universal codebook.

8. The method of claim 7, wherein the plurality of universal codewords are used to train a large codeword model.

9. The method of claim 7, wherein updated models of the lightweight codeword model or the compression network may be stored in and transferred between the edge server, the midserver, and the cloud.

10. The method of claim 6, wherein a plurality of codebooks may be stored on the midserver and used to generate codewords for a plurality of edge servers, wherein each edge server has its own specific set of codewords.

11. A non-transitory, computer-readable storage media having computer-executable instructions embodied thereon that, when executed by one or more processors of a computing system employing an asset registry platform for secure, robust, and efficient blockchain management system using large codeword models, cause the computing system to:
   process input data through a compression network on an edge server to generate a plurality of compressed data;
   transmit the plurality of compressed data to a midserver, wherein the midserver converts the plurality of compressed data into a plurality of codewords using a codebook;

train and deploy a lightweight codeword model on the edge server wherein the lightweight codeword model is trained using the plurality of codewords; and compress the input data through the lightweight codeword model on the edge server to generate a second plurality of compressed data.

12. The media of claim 11, wherein the plurality of codewords are transmitted to a cloud that converts the plurality of codewords into a plurality of codewords using a universal codebook.

13. The media of claim 12, wherein the plurality of universal codewords are used to train a large codeword model.

14. The media of claim 12, wherein updated models of the lightweight codeword model or the compression network may be stored in and transferred between the edge server, the midserver, and the cloud.

15. The media of claim 11, wherein a plurality of codebooks may be stored on the midserver and used to generate codewords for a plurality of edge servers, wherein each edge server has its own specific set of codewords.

\* \* \* \* \*